(12) United States Patent
Lo Hine Tong et al.

(10) Patent No.: US 8,063,719 B2
(45) Date of Patent: Nov. 22, 2011

(54) OFFSET FOOTPRINT OF A CONNECTOR ON A PRINTED BOARD

(75) Inventors: Dominique Lo Hine Tong, Rennes (FR); Philippe Minard, Saint Medard sur Ille (FR); Jean-Luc Le Bras, Rennes (FR)

(73) Assignee: Thomson Licensing, Boulogne-Billancourt (FR)

( * ) Notice: Subject to any disclaimer, the term of this patent is extended or adjusted under 35 U.S.C. 154(b) by 277 days.

(21) Appl. No.: 12/154,039

(22) Filed: May 20, 2008

(65) Prior Publication Data

US 2008/0290967 A1    Nov. 27, 2008

(30) Foreign Application Priority Data

May 21, 2007    (EP) ...................................... 0755167

(51) Int. Cl.
*H01P 1/00* (2006.01)
*H03H 7/00* (2006.01)
(52) U.S. Cl. .......... 333/185; 333/33; 333/247; 333/254; 333/260
(58) Field of Classification Search .................... 333/33, 333/34, 185, 247, 254, 260
See application file for complete search history.

(56) References Cited

U.S. PATENT DOCUMENTS

| | | | |
|---|---|---|---|
| 5,994,983 A * | 11/1999 | Andersson | 333/246 |
| 6,727,777 B2 * | 4/2004 | McDonough et al. | 333/33 |
| 6,980,068 B2 * | 12/2005 | Miyazawa et al. | 333/260 |
| 7,443,272 B2 * | 10/2008 | Jiang et al. | 333/260 |
| 2004/0018814 A1 | 1/2004 | Lin et al. | |
| 2005/0200431 A1 | 9/2005 | Lin et al. | |
| 2006/0049482 A1 * | 3/2006 | Barton et al. | 257/531 |
| 2007/0134953 A1 | 6/2007 | Morana et al. | |
| 2008/0023219 A1 | 1/2008 | Yoshizawa et al. | |

FOREIGN PATENT DOCUMENTS

| | | |
|---|---|---|
| EP | 1780769 A2 | 5/2007 |
| WO | WO 2006/009274 A1 | 1/2006 |
| WO | 20070132406 | 11/2007 |

OTHER PUBLICATIONS

Search report dated Oct. 12, 2007.
European Search Report Dated Jul. 15, 2008.
EP Communication dated May 26, 2009.
Response to EP May 26, 2009 communication.
EP communication dated Oct. 30, 2009 with intent to grant.
EP Decision to grant dated Feb. 18, 2010.

* cited by examiner

*Primary Examiner* — Robert Pascal
*Assistant Examiner* — Kimberly Glenn
(74) *Attorney, Agent, or Firm* — Robert D. Shedd; Joseph J. Opalach; Jerome G. Schaefer

(57) ABSTRACT

A printed wiring board having at least one connector includes a dielectric substrate that has, on a first face, a first ground plane, and on a second face, at least two transmission lines between which the connector and a footprint are mounted. The footprint includes a first element positioned between the two transmission lines under the connector. The first element forming with the first ground plane, a capacitive element and, at each extremity of the first element, second elements forming with the first element, a self-inductive and capacitive element. The second elements each extending by a second ground plane, the second ground planes which are connected to the first ground plane.

7 Claims, 6 Drawing Sheets

OFFSET FOOTPRINT OF A CONNECTOR ON A PRINTED BOARD

This application claims the benefit, under 35 U.S.C. §119, of European Patent Application No. 0755167 of 21 May 2007.

The present invention relates to printed circuit boards able to hold connectors, notably test connectors.

More particularly, the present invention relates to an improvement of the transfer footprint or land pattern of said connector on the printed circuit board together with a method for producing said pattern.

BACKGROUND OF THE INVENTION

The present invention will be described by referring to a printed circuit board on which reception antenna are mounted but also the transmission/reception system, namely the "Front End Radio" circuit for wireless communication applications. However, it is obvious for a person skilled in the art that the present invention can be used on any printed circuit board requiring the use of test connectors.

Hence, as shown diagrammatically in FIG. 1 which shows a printed circuit board of the market on which an RF circuit (radiofrequency) is mounted, a test connector 1 is mounted on each of the printed lines 2 connecting a printed antenna such as antenna 3 to one of the inputs 4 of an RF circuit referenced 5. The test connectors that are in fact miniature connectors are automatically and definitively transferred on the printed circuit board, between the antennas and the RF circuit.

As shown in FIG. 2 of which the left-hand part relates to the operational mode and the right-hand part the test mode of a miniature connector, each connector comprises a mechanical switching system constituted mainly of two overlapping blades 10, 11, the blade 10 being offset on the RF circuit side input line whereas the blade 11 that overlaps the end of the blade 10 is an elastic blade offset and fixed to the output line on the antenna side.

The operation of such a connector is as follows. In operational mode, the two blades 10, 11 are in short-circuit and the transmission/reception signal (E/R) of the RF circuit is connected directly to the antenna in return for some insertion loss. In test mode, a coaxial probe referenced 12 in FIG. 2, equipped with a suitable adaptor, is plugged into the connector of the board. This has the effect of separating the blade 11 from the blade 10 by disconnecting in this manner the RF channel from the antenna channel and this enables the transmission/reception signal (E/R) of the RF circuit to be recovered in order for it to be measured.

Currently, the offset footprints of a test connector recommended by connector manufacturers have a shape such as the one shown in FIG. 3. Hence, in a more precise manner, on a part of the substrate 100 of the printed circuit board, the two metal feeder lines 101, 102 are realised. These two lines are found between two ground plane elements 103, 104. At the attachment site of the connector, each of the lines extends by a solder stud referenced 105, 106. Moreover, four solder studs 107 enable the connector to be attached to the board. A conductive material footprint 108 connects the two ground planes 103, 104 by passing between the solder studs.

As shown in FIG. 3, this footprint or pattern is connected by a metallised hole 109 to the lower ground plane of the printed board. Other metallised holes also connect the ground planes 103, 104 to the lower ground plane. The metallised holes enable the ground continuity to be provided between the lower and upper planes of the substrate.

The simulations conducted with test connectors of the market mounted on a footprint such as described with reference to FIG. 3, show that the transmission response (S21) is of the quasi low-pass type for the chosen operating band. Said response is due essentially to the form of the central parts of the connector that have been designed to meet two constraints, namely:

A mechanical constraint consisting in providing a perfect and reliable connection in operational mode of the two parts and a connection between the mobile part of the blades of the test connector in test mode.

Electrical constraints, namely to provide in particular in the operational mode, a perfect impedance matching to the access lines of characteristic impedance 50 ohms in the specified operating band.

BRIEF SUMMARY OF THE INVENTION

The present invention proposes an improvement to the transfer footprint or land pattern that enables an integrated selective filtering response to be created.

The present invention relates to a board featuring at least one connector, said board being constituted by a dielectric substrate comprising, on a first face, a first ground plane and on a second face, at least two transmission lines between which the connector and a footprint are mounted, characterized in that the footprint comprises a first element positioned between the two transmission lines under the connector, said first element forming with the first ground plane, a capacitive element and, at each extremity of the first element, second elements forming with the first element, a self-inductive and capacitive element, said second elements each extending by a second ground plane, the second ground planes being connected to the first ground plane.

According to one embodiment, the first and second elements are constituted by conductive lines.

The dimensions of the conductive lines are chosen so that the resonant frequency of the first and second elements forming capacitive and inductive elements corresponds to the frequency band to filter.

According to another characteristic of the present invention in the case of a multilayer substrate, at least one floating conductive plane is placed under the first element of the footprint.

According to one embodiment, the second ground planes are connected to the first ground plane by a via or metallised hole positioned near the second elements of the footprint.

According to another characteristic of the present invention, the connector is a miniature connector, notably a test connector.

The present invention also relates to a method for producing a footprint for connector on a printed circuit board comprising the steps consisting in:

etching, on the face of the substrate opposite the face covered by a first ground plane, between the two transmission lines connected to the connector, a conductive footprint comprising a first element perpendicular to the transmission lines forming with the ground plane a capacitive element and at least at one extremity of the first element, a second element forming with the first element, a self-inductive and capacitive element, the footprint extending on said face by second ground planes and, connecting the second ground planes to the first ground plane by vias or metallised holes.

BRIEF DESCRIPTION OF THE DRAWINGS

Other characteristics and advantages of the present invention will emerge on reading the description of the different embodiments, said description being made with reference to the drawings attached in the appendix, wherein.

To simplify the description in the figures, the same elements often have the same references.

DESCRIPTION OF PREFERRED EMBODIMENT

A description will first be given with reference to FIGS. 4 and 5, of the electrical operation of a transfer footprint of a connector according to the prior art.

Figure 1:
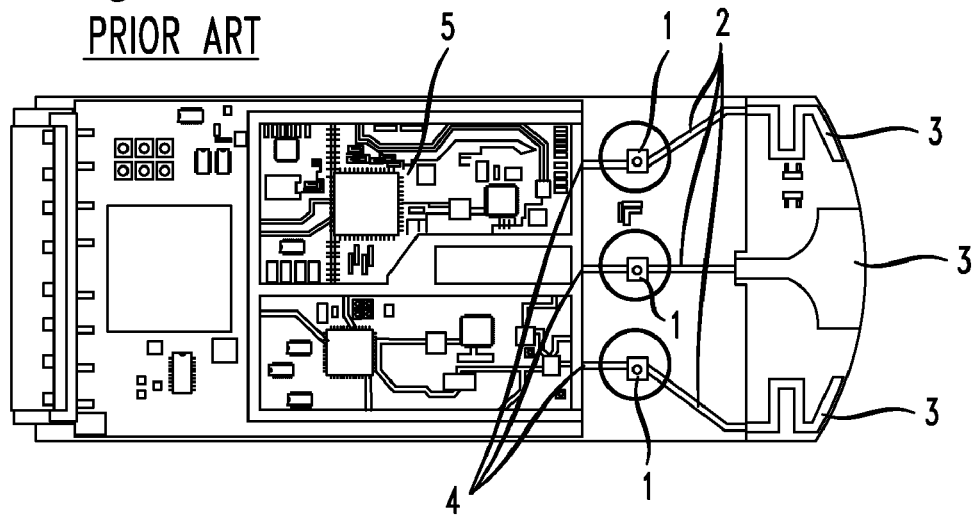
FIG. 1, already described, is a top plane view of a printed circuit board equipped with test connectors, available on the market.
Figure 2:
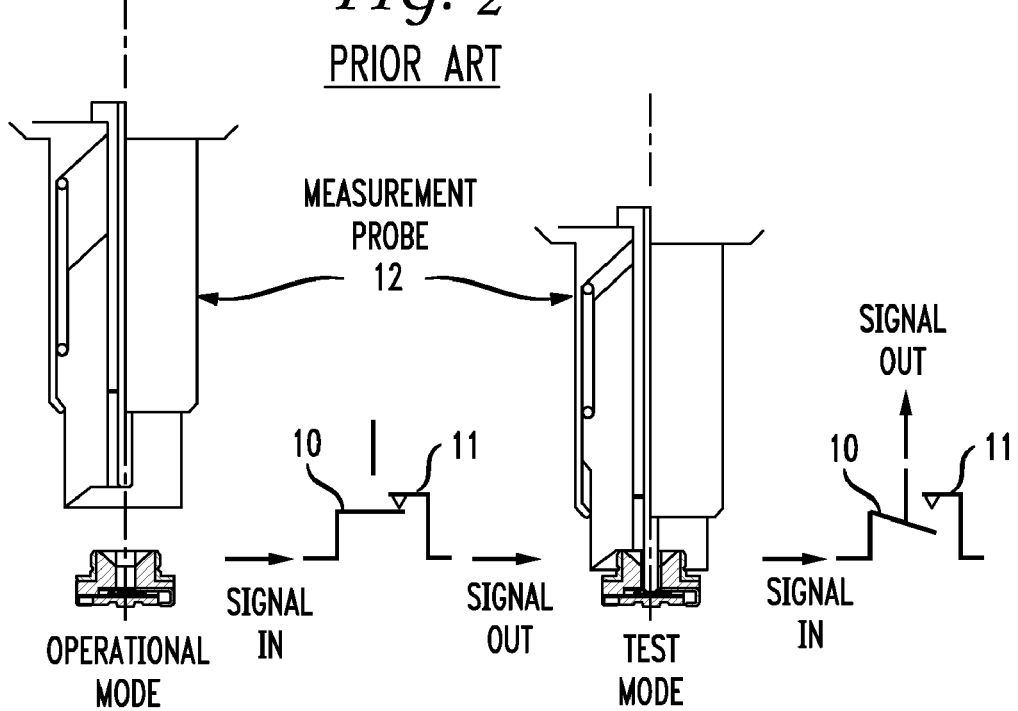
FIG. 2, already described, is a highly diagrammatic cross-section view explaining the operation of the test connectors to which the present invention applies.
Figure 3:
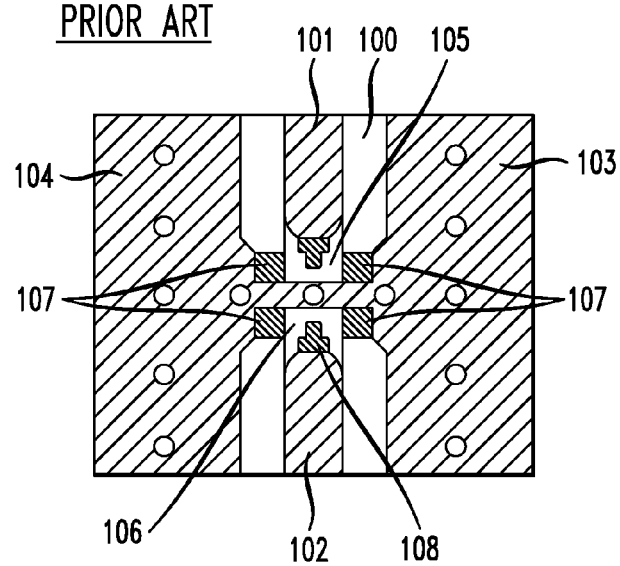
FIG. 3, already described, is a diagrammatic plane view of the footprint or pattern realised on a printed circuit board enabling a test connector to be offset.
Figure 4:
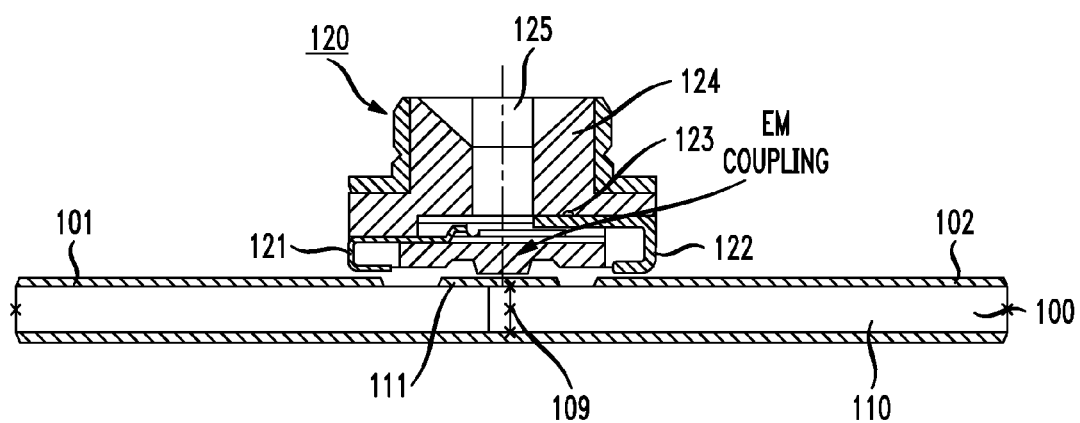
FIG. 4 is a cross-section view showing the transfer of a test connector on a printed circuit board, according to the prior art.
Figure 5:
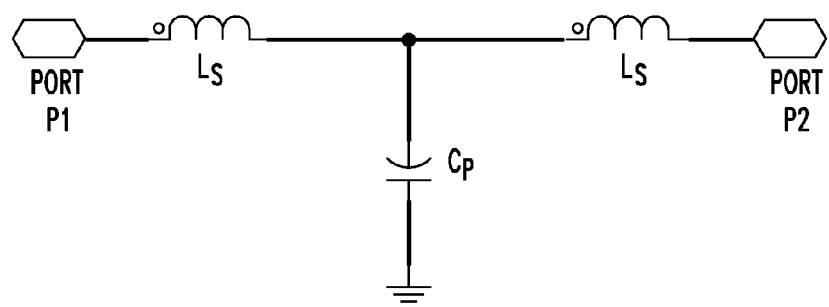
FIG. 5 is an equivalent circuit diagram of a connector with footprint such as defined in FIG. 3.

As shown in FIG. 4, on a printed circuit board formed by a dielectric substrate 100 provided on its lower face with a ground plane 109, two metallised access lines 101, 102 were realised. Between one extremity of each of these lines, a connector 120 is mounted. This connector comprises within a box 124, a first metal blade 121 in the shape of a U that is soldered to the extremity of the line 101 and a second metal blade in the form of a J 122 that is soldered to the extremity of the line 102. Between the two extremities of the blades 121, 122 a central blade 123 is mounted. Said central blade is attached to the free extremity of the blade 121 and is mobile in relation to the free extremity of the blade 122. The box 124 is equipped in its middle with an aperture 125 designed to receive the test probe. Between the two access lines 101, 102 is realised, under the connector, a conductive footprint 111 that is connected to the ground plane 110 of the printed circuit board by means of a metallised hole 109 or via.

A test conducted with an assembly such as shown in FIG. 4 shows that the transmission response S21 obtained is of the quasi low-pass type for a large bandwidth. The structure of FIG. 4 can therefore be modelled according to the equivalent circuit diagram of FIG. 5, namely the ports P1 and P2 show the attachment points of the blades of the connector to the two access lines. the self-inductances Ls show the parasitic self-inductance of the two metal blades 121, 122 and Cp the parasitic coupling capacitor between these metal blades and the ground plane 111 crossing the connector, this ground plane 111 being connected to the ground plane 110 of the board by means of the metallised hole 109.

The present invention relates to a modification of the footprint enabling a filtering function to be integrated directly. This type of footprint with filtering function is particularly interesting, as one thus avoids the integration of additional filters on the board. The result is a reduction in the manufacturing cost and space savings.

Figure 6:
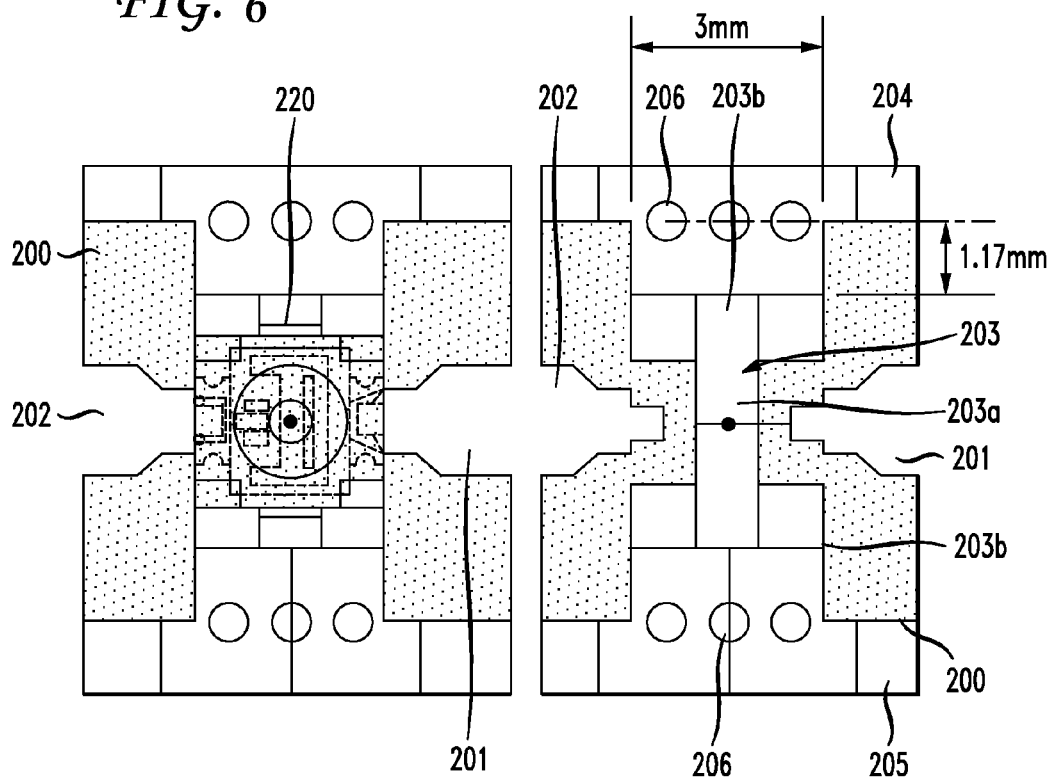
FIG. 6 is a top plane view of a footprint in accordance with the present invention for the transfer on a printed circuit board of a connector.
Figure 7:
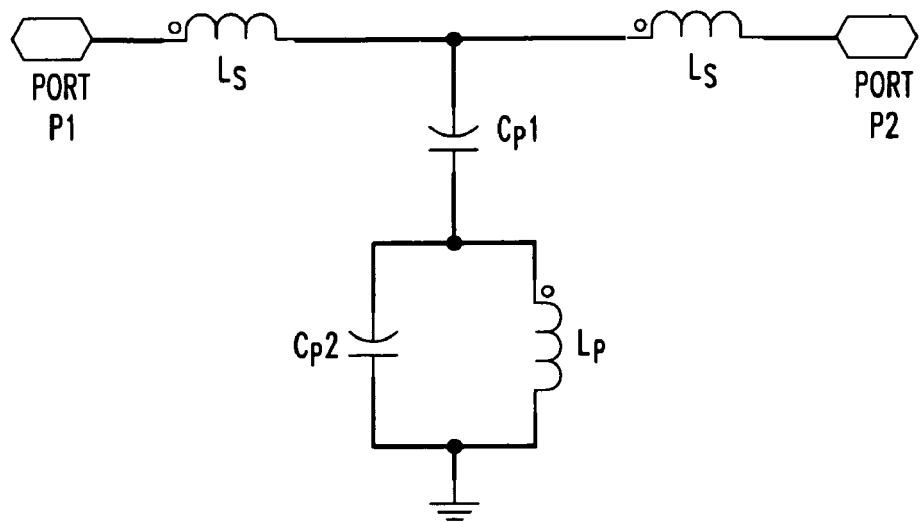
FIG. 7 shows the equivalent circuit diagram of the connector with a footprint such as shown in FIG. 6.

A description will now be given with reference to FIGS. 6, 7 and 8, of a footprint for test connector in accordance with the present invention. On the right-hand part of FIG. 6, an embodiment of the invention was shown whereas the left-hand part shows a diagrammatic top view of the footprint equipped with said connector. Hence, as shown in FIG. 6, on a printed circuit board formed by a dielectric substrate 200 provided on its lower face with a ground plane, two access conductive lines have been realised 201, 202. Between the two extremities of these lines 201, 202 a test connector 220 is mounted.

As shown on the right-hand part of FIG. 6, between the extremities of the two access lines 201, 202, on the substrate 200 is realised a conductive footprint 203 comprising a first element 203a passing between the two extremities 201 and 202, this first element 203a is a termination line dimensioned to form a capacitive element. This element 203a extends at each of its extremities by second elements 203b having a width larger than the element 203a. The elements 203b are formed by termination lines dimensioned to realise self-inductance and capacitive elements. The circuit diagram of the footprint realised above will be explained in a more detailed manner with reference to FIG. 7. This footprint 203 extends by upper ground planes 204, 205 that are connected to the lower ground plane not shown by means of metallised holes or vias 206.

In the embodiment of FIG. 6, in contrast to known footprints, the footprint 203 is not connected in its middle to the lower ground plane. Therefore, the footprint of FIG. 6 equipped with the connector 220 can be modelled according to the equivalent circuit diagram of FIG. 7. In this case, the ports P1 and P2 show the attachment points of the blades of the connector on the two access lines 201 and 202. The self-inductances Ls show the parasitic self-inductance of the two metal blades of the connector 220 and Cp1 the parasitic coupling capacitance between these metal blades and the conductive element 203a crossing the connector. Within the context of the present invention, this element 203a not being connected to the ground plane, it forms a capacitive element shown by the capacitor Cp2 corresponding to the capacitance between the line 203a and the lower ground plane of the substrate. This capacitor Cp2 is mounted in parallel with a self-inductance Lp that represents the equivalent parasitic self-inductance of the elements 203b that extend the line 203a and connect it to the ground planes 204 and 205 that are grounded by the metallised holes 206.

A footprint such as described above was simulated by using the following elements: the footprint is realised on a substrate of FR4 type of thickness 1 mm and permittivity 4.4.

The footprint is realised in a metal material such as copper with the element 203a having a width of 1.1 mm and a length of 2 mm, the second elements 203b having the following dimensions 3 mm*2.17 mm. These dimensions were chosen such that the following values are obtained for the self inductance and the capacitors of the equivalent circuit:

$Ls=0.4$ nH,
$Cp1=0.7$ pF,
$Cp2=0.2$ pF,
$Lp=0.22$ nH.

Figure 8:
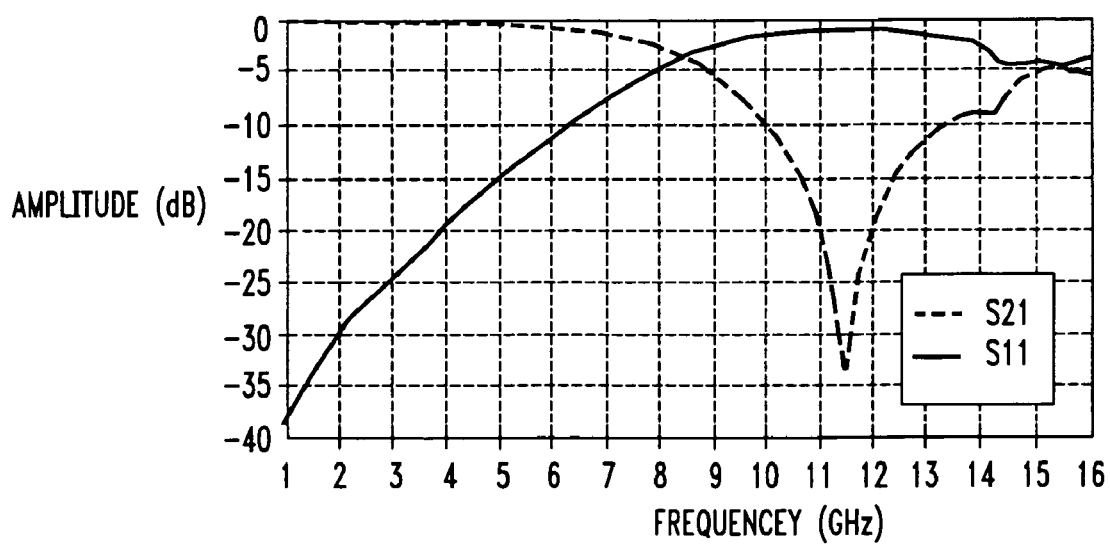
FIG. 8 shows the transmission and impedance matching curves of the footprint of FIG. 6.

With the values given above, it is obtained by electromagnetic simulation by using the ADS simulator from Agilent a transmission S21 and return loss S11 response such as shown in FIG. 8. In this case, the footprint thus realised can obtain a rejection at 11.5 GHz, the 2 harmonics are then filtered in the case of a wireless application at 5.5 GHz.

A description will now be given with reference to FIG. 9, of another embodiment of a footprint in accordance with the present invention. As shown in the right-hand part of FIG. 9 the footprint 203' extends on each side by the line elements 207. In this case, the ground planes 204, 205 are connected to the lower ground plane by vias 206 that are further from the footprint than in the traditional case. The connector 220 is soldered in an identical manner to the first embodiment, to the extremities of the access lines 201, 202.

Figure 9:
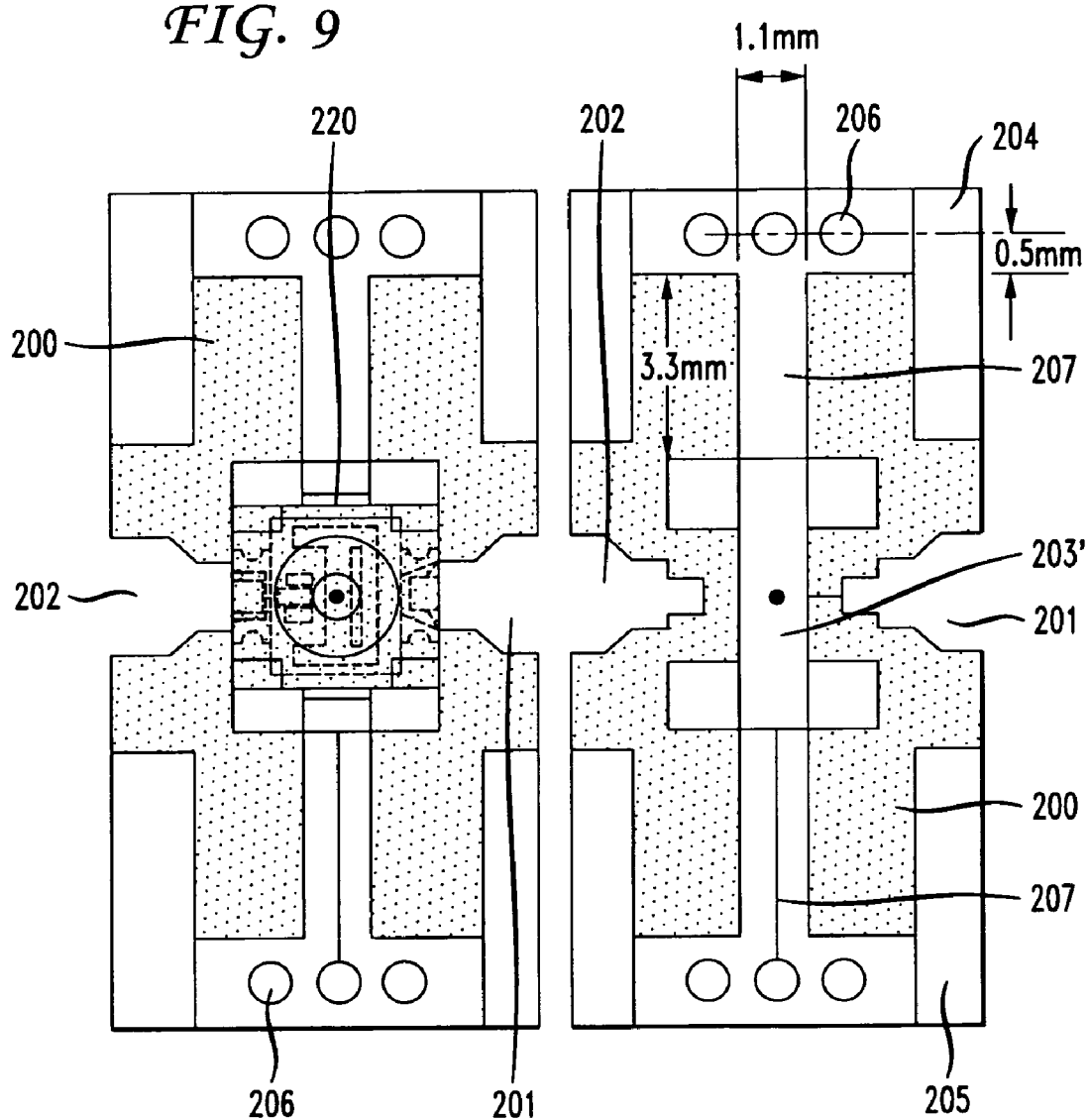
FIG. 9 is a top plane view of another embodiment of a footprint according to the present invention.

As shown in the right-hand part of FIG. 9, the additional line element 207 has a length of 3.3 mm and a width of 1.1 mm. The metallised vias 206 are at a distance 0.5 mm from the extremity of the element 207. This greater length of line leads to a modification of the resonance frequency by modifying the self-inductance value.

A description will now be given with reference to FIG. 10, of another embodiment of a footprint in accordance with the present invention. In this case, the substrate used is a multi-layer substrate that has the advantage of having an additional degree of freedom for the design of a footprint making it possible to meet a particular filtering template in terms of central frequency and bandwidth.

Figure 10:
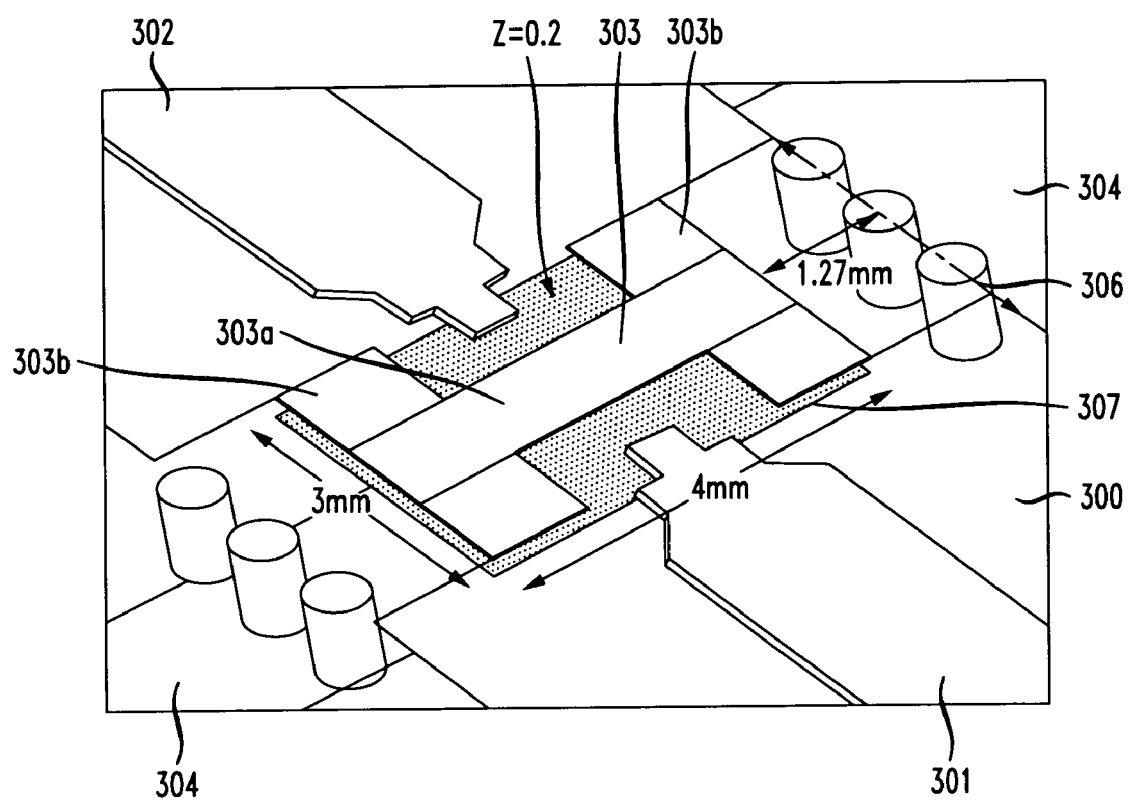
FIG. 10 is a diagrammatic perspective view of an additional embodiment of a footprint in accordance with the present invention.

As shown in FIG. 10, the reference 300 diagrammatically describes the substrate. On the upper part of the substrate have been realised two access lines 301, 302 between the extremities of which is formed the footprint 303 in accordance with the present invention. Between the two extremities of the lines 301 and 302 are also mounted the two blades of the connector, as mentioned above. The footprint 303 comprises, as the footprint of FIG. 6, a first element 300a that extends on each side by two perpendicular elements 300b having a self-inductance and capacitive effect. The footprint 303 is connected on each side to an upper ground plane 304 that is connected by metallised holes 306 to the lower ground plane 300.

As clearly shown in FIG. 10, below the footprint 303 is realised a floating conductive element 307. This element can give an increase in the width of the rejection band.

The footprints described above integrate a selective filtering function. It is no longer necessary to add an external component to realise this function.

The invention claimed is:

1. A board receiving at least one connector, the board comprising a dielectric substrate comprising on a first face a first ground plane and on a second face, at least two transmission lines between which the at least one connector and a footprint are mounted, wherein the footprint comprises a first element positioned between the at least two transmission lines under the connector, the first element forming with the first ground plane, a first capacitive element and, at least at one extremity of the first element, a second element forming with the first element, a self-inductive and capacitive element, the second element extending by at least one second ground plane, the at least one second ground plane being connected to the first ground plane.

2. The board according to claim 1, wherein the first and second elements comprise conductive lines.

3. The board according to claim 2, wherein the conductive lines forming the first element and the second element have dimensions giving a resonant frequency corresponding to a frequency to filter.

4. The board according to claim 1, wherein at least one floating conductive layer is placed under the footprint.

5. The board according to claim 1, wherein the at least one second ground plane is connected to the first ground plane by at least one via positioned near the second element of the footprint.

6. The board according to claim 1, wherein the connector is a test connector.

7. A method for producing a footprint for a connector on a printed circuit board provided with a substrate having a face covered by a first ground plan, the method comprising:
    etching, on a face of the substrate opposite the face covered by a the first ground plane, between two transmission lines connected to the connector, the footprint comprising a first element perpendicular to the two transmission lines forming with the first ground plane a first capacitive element and at least at one extremity of the first element, a second element forming with the first element, a self-inductive and capacitive element, the footprint extending on the face by second ground planes; and
    connecting the second ground planes to the first ground plane by vias or metalized holes.

* * * * *